(12) United States Patent
Lee et al.

(10) Patent No.: US 7,498,958 B1
(45) Date of Patent: Mar. 3, 2009

(54) FRACTIONAL SAMPLING FILTER

(75) Inventors: Wayne S. Lee, San Mateo, CA (US);
Kan G. Hoy, Fremont, CA (US)

(73) Assignee: Matsushita Electric Industrial, Osaka (JP)

( * ) Notice: Subject to any disclaimer, the term of this patent is extended or adjusted under 35 U.S.C. 154(b) by 0 days.

(21) Appl. No.: 11/880,416

(22) Filed: Jul. 19, 2007

(51) Int. Cl.
*H03M 7/00* (2006.01)
(52) U.S. Cl. .................................. 341/61; 341/122
(58) Field of Classification Search .................. 341/61, 341/122, 125; 375/261, 328, 340
See application file for complete search history.

(56) References Cited

U.S. PATENT DOCUMENTS 4,961,206 A * 10/1990 Tomlinson et al. .......... 375/261
6,275,836 B1 * 8/2001 Lu ............................. 708/313
6,704,383 B2 * 3/2004 Lee et al. .................... 375/376

* cited by examiner

*Primary Examiner*—Brian Young
(74) *Attorney, Agent, or Firm*—Haverstock & Owens LLP

(57) ABSTRACT

A fractional up-sampling filter is configured to convert a lower data rate to a higher data rate by using methods of interpolation to generate output digital data that corresponds to the higher data rate. For example, if the higher data rate output is 4/3 of the lower data rate input, then for every three (3) digital data values originally sampled by the fractional up-sampling filter, four (4) output digital data values are generated and output from the filter. These output digital data values are obtained by methods of interpolation. Interpolation is performed using different filter coefficients depending on the relative timing of the output digital data rate versus the original sampling rate. The fractional up-sampling filter utilizes a high frequency master clock to derive the fractional relationship between the original sampling rate to the new fractional sampling rate.

17 Claims, 4 Drawing Sheets

FRACTIONAL SAMPLING FILTER

FIELD OF THE INVENTION

The present invention relates to data rate conversion and digital-to-analog converters. More particularly, the present invention relates to a fractional digital sampling filter configured to convert digital data sampled at a first data rate to digital data corresponding to a second data rate.

BACKGROUND OF THE INVENTION

Digital transceivers use digital-to-analog converters (DACs) to convert modulated digital signals to corresponding analogs for transmission. Ideally, the frequency response of the analog signal includes information exclusive to the transmission band. However, in implementation, frequency spurs are generated in the bands adjacent to the transmission band, referred to as the receiving bands. These frequency spurs are in part an undesirable artifact of the digital-to-analog conversion process, and are therefore referred to as DAC images. The frequency at which the frequency spurs occur is determined by the sampling rate of the DAC.

One conventional method for removing, or minimizing the frequency spurs in the receiving bands is to double the sampling rate. Increasing the sampling rate is referred to as up-sampling. If frequency spurs are generated in the receiving bands when the DAC uses a first sampling rate, then doubling the sampling rate essentially moves the frequency spurs from the receiving band to the next adjacent band. Although doubling the sampling rate is effective in minimizing the frequency spurs in the receiving band, doubling the sampling rate requires a significant increase in power. For a portable device, such as a cellular telephone, this increased power shortens battery life.

Up-sampling is typically performed according to an up-sampling factor. The up-sampling factor can be an integer, denoted for example by M, as in the case of doubling the sampling rate, M=2, or the up-sampling factor can be a fraction greater than unity, such as M/N. Conventionally, fractional up-sampling is performed by first up-sampling by a factor of M, and then down-sampling by a factor of N. A fraction up-sampling filter is typically used to execute the fractional up-sampling. Using a typical fractional up-sampling filter, digital data at a lower clock rate is first up-sampled to a common multiple higher clock rate by injecting zeroes in the data stream. The result is then passed through a digital low-pass filter to remove higher frequency components induced by the injection of zeroes. Finally, a decimation of the resultant data stream is performed to obtain the desired data rate according to the up-sampling factor.

FIG. 1 illustrates a block diagram of a conventional fractional up-sampling filter. Digital data previously sampled at a first sample rate is up-sampled by an up-sampling filter 14. The up-sampling filter 14 up-samples the digital data by a factor of M, executed according to the clock rate of the clock 10. Digital data up-sampled by a factor of M is output from the up-sampling filter 14. This up-sampled digital data is passed to a down-sampling filter 18 via an anti-aliasing filter 16. The anti-aliasing filter 16 prevents aliasing, a form of distortion, in the conversion of the digital data samples back to a continuous analog signal. The down-sampling filter 18 down-samples the up-sampled digital data by a factor of N, executed according to the clock rate of the clock 12. This results in digital data up-sampled by a fractional up-sampling factor of M/N. The down-sampling filter 18 outputs the fractionally up-sampled digital data.

A significant drawback of the conventional fractional up-sampling filter is that the first up-sampling stage requires a relatively high clock rate. The process of up-sampling all of the digital data at the high clock rate, only to subsequently down-sample the up-sampled data is extremely inefficient, and also introduces spurious effects into the data. Power consumption is also a concern since more circuitry will be operated at a higher clock rate.

SUMMARY OF THE INVENTION

Embodiments of the present invention are directed to a fractional sampling filter. In some embodiments, the fractional sampling filter is a fractional up-sampling filter configured to convert digital data sampled at a lower sampling rate to digital data corresponding to a higher sampling rate, e.g. fractional up-sampling. In other embodiments, the fractional sampling filter is a fractional down-sampling filter configured to convert digital data sampled at a higher sampling rate to digital data corresponding to a lower sampling rate, e.g. fractional down-sampling. For simplicity, the fractional sampling filter is described below in the context of a fractional up-sampling filter, although it is understood that the concepts described herein can be equally applied to a fractional down-sampling filter. Embodiments of a fractional up-sampling filter eliminate the need for a higher clock rate to be applied to the entire digital data stream, remove the additional filtering stage at the higher clock rate, and removes the decimation stage (down-sampling filter) as compared to the conventional fractional up-sampling filter.

In one aspect, a machine includes a first clock with a first clock rate, a second clock with a second clock rate different than the first clock rate, a third clock with a third clock rate, wherein the first clock rate and the second clock rate are each derived from the third clock rate, a sampling module configured to sample an input signal according to the first clock rate and to output a corresponding digital signal, wherein the digital signal includes a plurality of first digital data values, a data conversion module coupled to the sampling module to receive the digital signal, wherein the data conversion module is configured to calculate a plurality of second digital data values according to the plurality of first digital data values, and a holding circuit configured to input, to hold, and to output the plurality of second digital data values according to the second clock rate, thereby outputting a fractionally sampled digital signal from the fractional sampling filter. A number of second digital data values is calculated according to a fractional sampling factor multiplied by a number of the first digital data values, wherein the fractional sampling factor is a ratio between the second clock rate and the first clock rate. The first clock can include a divide by x circuit, and the first clock rate can be the third clock rate divided by x. The second clock can include a divide by y circuit, and the second clock rate can be the third clock rate divided by y. The fractional sampling factor can be y divided by x. The fractional sampling filter can be a fractional up-sampling filter. The second clock rate can be greater than the first clock rate. The number of second digital data values can be greater than the number of first digital data values. The fractional sampling filter can be a fractional down-sampling filter. The second clock rate can be less than the first clock rate. The number of second digital data values can be less than the number of first digital data values. An interpolation algorithm is configured to use different filter coefficients applied to first digital data values, wherein each filter coefficient is determined by a relative timing of the second clock rate versus the first clock rate. An interpolation method can include a linear interpolation whereby each second digital data value is calculated by averaging two or more first digital data values most adjacent to the second digital data value. The machine can also include a digital-to-analog converter coupled to the fractional sampling filter, wherein the fractionally sampled digital signal is input to the digital-to-analog converter, and the digital-to-analog converter is configured to convert the fractionally sampled digital signal to an output signal, thereby reducing frequency spurs in the receiving band of the output signal.

In another aspect, a method includes deriving a first clock rate from a master clock rate, deriving a second clock rate from the master clock, wherein the second clock rate is different than the first clock rate, sampling an input signal according to the first clock rate, thereby generating a first digital signal, wherein the first digital signal includes a plurality of first digital data values, calculating a plurality of second digital data values according to the plurality of first digital data values, holding each of the plurality of second digital data values as each second digital data value is calculated, and sequentially outputting each of the plurality of digital data values according to the second clock rate, thereby outputting a fractionally sampled digital signal.

In yet another aspect, a machine include a receiver portion configured to receive radio frequency signals in a receive frequency band and a transmitter portion including a fractional sampling filter. The fractional sampling filter includes a sampling module configured to sample an analog signal according to a first clock rate and to output a first digital signal, and a module configured to calculate a plurality of data values based on the first digital signal, the first clock rate, and a second clock rate different than the first clock rate, wherein the first clock rate and the second clock rate are determined based on the receive frequency band.

BRIEF DESCRIPTION OF THE SEVERAL VIEWS OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION

Embodiments of the present invention are directed to a fractional sampling filter. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

A fractional up-sampling filter is configured to convert a lower data rate to a higher data rate by using methods of interpolation to generate output digital data that corresponds to the higher data rate. For example, if the higher data rate output is 4/3 of the lower data rate input, then for every three (3) digital data values originally sampled by the fractional up-sampling filter, four (4) output digital data values are generated and output from the filter. These output digital data values are obtained by methods of interpolation. Interpolation is performed using different filter coefficients depending on the relative timing of the output digital data rate versus the original sampling rate. The fractional up-sampling filter utilizes a high frequency master clock to derive the fractional relationship between the original sampling rate to the new fractional sampling rate.

Figure 1:
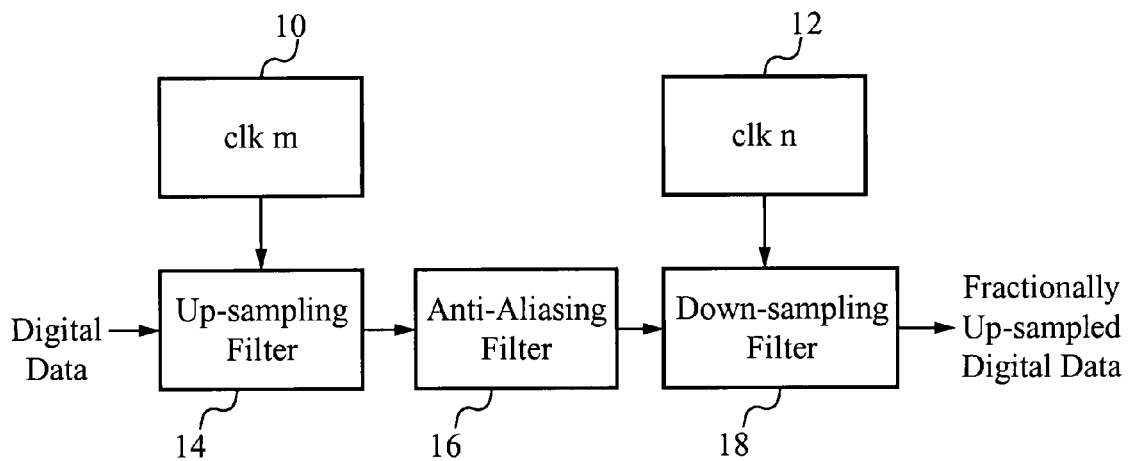
FIG. 1 illustrates a block diagram of a conventional fractional up-sampling filter.
Figure 2:
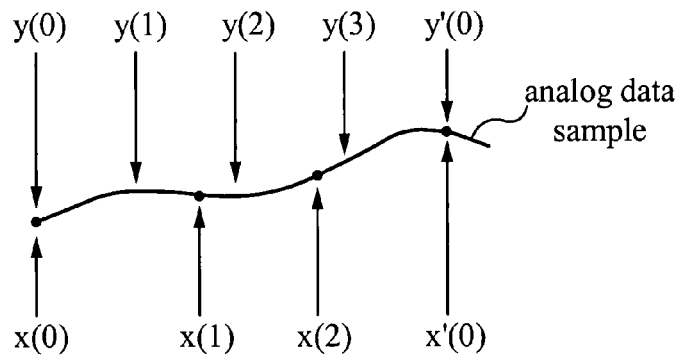
FIG. 2 illustrates an exemplary relative timing diagram corresponding to a fractional up-sampling factor of 4/3.

FIG. 2 illustrates an exemplary relative timing diagram corresponding to a fractional up-sampling factor of 4/3. In this case, a first set of digital data sampled at a first sampling rate is used to interpolate a second set of digital data corresponding to a higher second sampling rate. The first set of digital data are represented as x(0), x(1), x(2), and x'(0). The second set of digital data are represented as y(0), y(1), y(2), y(3), and y'(0). In one example, the first sampling rate is 53.76 MHz, and the second sampling rate is 71.68 MHz, where 71,68 MHz is 4/3 of 53.76 MHz. The first clock rate and the second clock rate are based on a higher frequency master clock rate of 215.04 MHz. This higher frequency master clock rate is divisible by four (4) and three (3) to generate the first clock rate of 53.76 MHz and the second clock rate of 71.68 MHz, respectively.

A general relationship between the first clock, the second clock, the master clock, and the fractional up-sampling factor:

first clock rate=(master clock rate)/$x$, second clock rate=(master clock rate)/$y$, fractional up-sampling factor=$y/x$.

An interpolation algorithm is performed at the required output rate to produce an output at the second sampling rate, in this case 71.68 MHz. Any conventional interpolation method can be used. In some embodiments, interpolation is performed using different filter coefficients depending on the relative timing of the output signal versus the original input signal. In the example above, the second digital data values Y represent the output of the 71.68 MHz interpolation algorithm, and the first digital data values X represent the resulting digital data sampled at the first clock rate, in this case 53.76 MHz. As can be seen in FIG. 2, the digital data points x(0) and y(0) are the same value since they occur at the same time, but the digital data point y(1) occurs ¾ of the way between x(0) and x(1), thus y(1) needs to be approximated. Likewise, y(2) is half-way between x(1) and x(2), and y(3) is one-quarter of the way between x(2) and x'(0). The digital data points x'(0) and y'(0) repeat the cycle.

The value of the digital data point y(0) is represented as f(y[0]). Each of the other digital data point values are similarly represented. According to the relative timing diagram shown in FIG. 2, each of the digital data point values are as follows:

$$f(y[0])=f(x[0]),$$

$$f(y[1])=\tfrac{3}{4}f(x[1])+\tfrac{1}{4}f(x[0]),$$

$$f(y[2])=\tfrac{1}{2}f(x[1])+\tfrac{1}{2}f(x[2]),$$

$$f(y[3])=\tfrac{1}{4}f(x'[0])+\tfrac{3}{4}f(x[2]),$$

$$f(y'[0])=f(x'[0]).$$

Interpolation using weighted coefficients is used to generate y(1), y(2) and y(3). In this case, the closer the digital data point Y is to the two adjacent digital data point X, the greater the weighting. It is understood that such a weighting scheme is merely exemplary, and any other weighting scheme can be used. Additionally, more than two digital data values X can be used to interpolate a digital data value Y.

Figure 3:
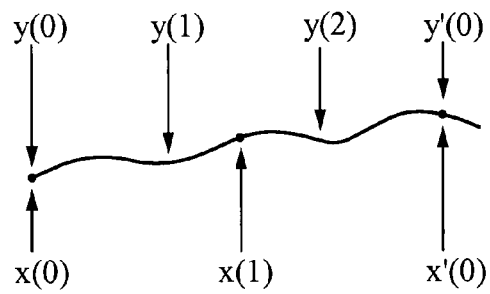
FIG. 3 illustrates an exemplary relative timing diagram corresponding to a fractional up-sampling factor of 3/2.

FIG. 3 illustrates an exemplary relative timing diagram corresponding to a fractional up-sampling factor of 3⁄2. In this case, the higher frequency master clock rate is divisible by three (3) and two (2) to generate the first clock rate and the second clock rate, respectively. As can be seen in FIG. 3, the digital data points x(0) and y(0) are the same value since they occur at the same time, but the digital data point y(1) occurs ⅔ of the way between x(0) and x(1), thus y(1) needs to be approximated. Likewise, y(2) is ⅓ between x(1) and x'(0). The digital data points x'(0) and y'(0) repeat the cycle.

According to the relative timing diagram shown in FIG. 3, each of the digital data point values are as follows:

$$f(y[0])=f(x[0]),$$

$$f(y[1])=\tfrac{1}{3}f(x[0])+\tfrac{2}{3}f(x[1]),$$

$$f(y[2])=\tfrac{2}{3}f(x[1])+\tfrac{1}{3}f(x'[0]),$$

$$f(y'[0])=f(x'[0]).$$

As with the relative timing diagram in FIG. 2, interpolation as applied to the timing diagram in FIG. 3 uses weighted coefficients to generate the values of y(1), y(2) and y(3). In this case, the closer the digital data point Y is to the two adjacent digital data point X, the greater the weighting. It is understood that such a weighting scheme is merely exemplary, and any other weighting scheme can be used. Additionally, more than two digital data values X can be used to interpolate a digital data value Y.

Figure 6:
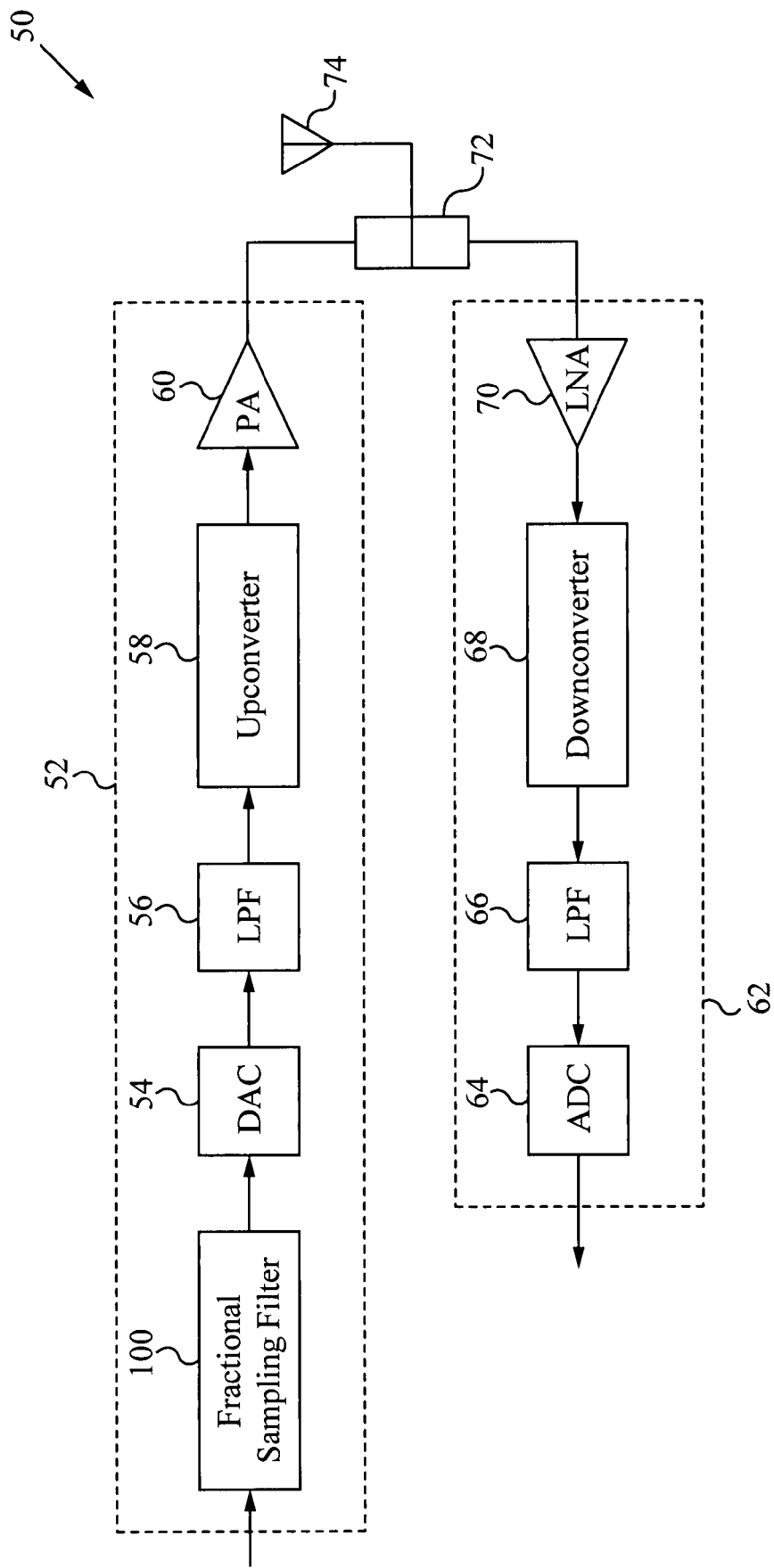
FIG. 6 illustrates a block diagram of a radio frequency (RF) transceiver.

FIG. 6 illustrates a block diagram of a radio frequency (RF) transceiver. The transceiver 50 includes a transmitter portion 52, a receiver portion 62, a duplexer 72, and an antenna 74. The transmitter portion 52 includes a fractional sampling filter 100, a digital-to-analog converter (DAC) 54, a low-pass filter (LPF) 56, an up-converter 58, and a power amplifier 60. The DAC 54 converts over-sampled signals into analog baseband signals. The analog baseband signals are filtered by the LPF 56 and up-converted to RF by the up-converter 58. The up-converted RF signals are coupled to a drive input of the power amplifier 60, which operates to amplify the up-converted RF signal and provide the resulting amplified RF signal to the antenna 74, via the duplexer 72.

The receiver portion 62 of the transceiver 50 includes a low noise amplifier (LNA) 70, a down-converter 68, a LPF 66, and an analog-to-digital converter (ADC) 64. The LNA 70 receives RF signals from the antenna 74, via the duplexer 72, and amplifies the RF signals. The amplified RF signals are then down-converted by the down-converter 68, filtered by the LPF 66, and finally converted to digital baseband over-sampled signals by the ADC 64.

DAC images are undesirable, since they contribute to noise, can desensitize the receiver portion of the transceiver, and can make it difficult to comply with noise requirements specified by standards.

Figure 4:
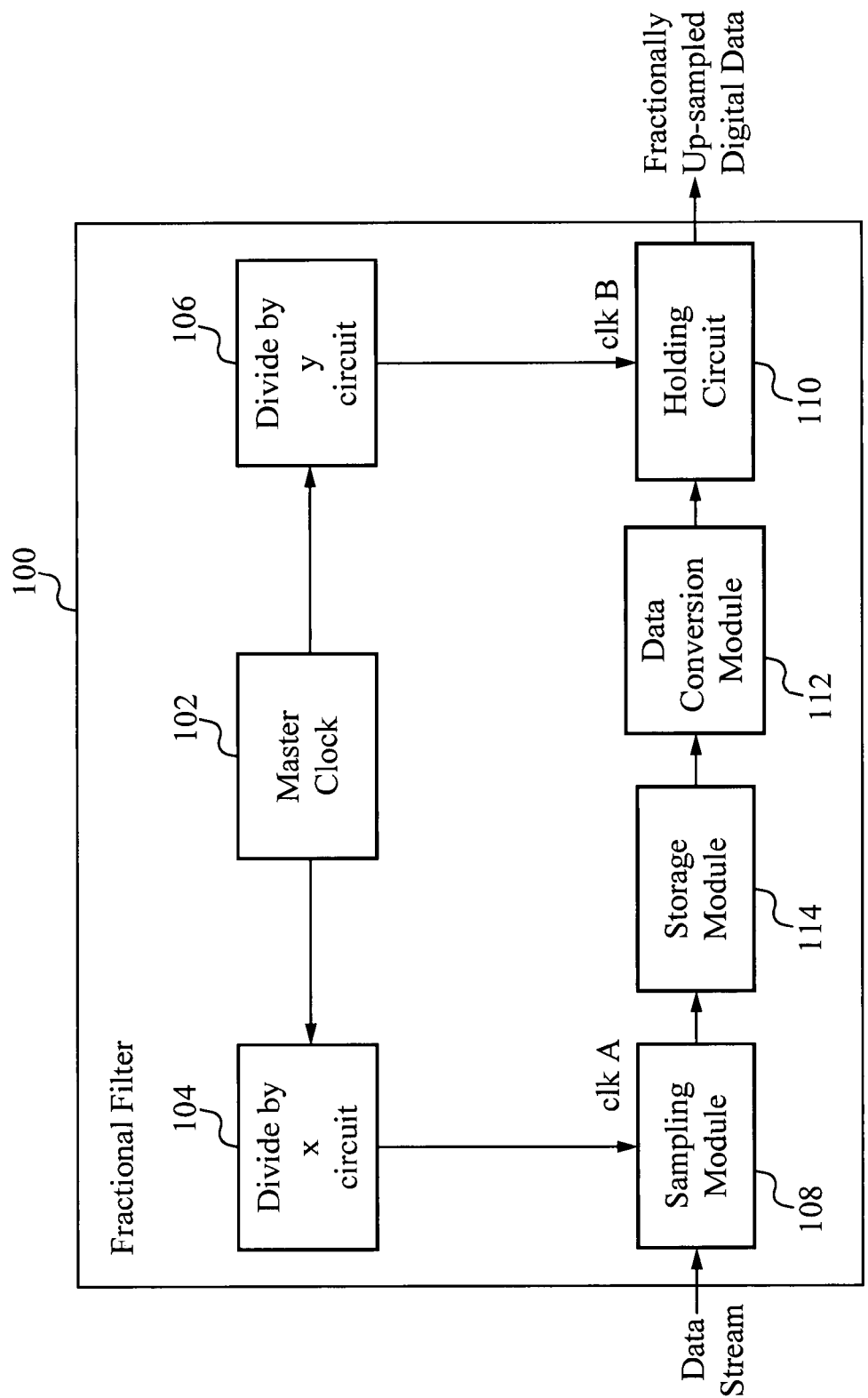
FIG. 4 illustrates an exemplary block diagram of a fractional up-sampling filter.

FIG. 4 illustrates an exemplary block diagram of the fractional up-sampling filter. The fractional up-sampling filter 100 includes a master clock 102, a divide by x circuit 104, a divide by y circuit 106, a sampling module 108, a holding circuit 110, a data conversion module 112, and an optional storage module 114. In some embodiments, the storage module 114 is part of the sampling module 108. An input signal is sampled according to an original sampling rate, referred to as a first sampling rate. A first clock with a first clock rate and a second clock with a second clock rate different than the first clock rate are both locked to the master clock 102. The master clock 102 has a master clock rate higher than either the first clock rate or the second clock rate. The first clock is implemented as the divide by x circuit 104 and the second clock is implemented as the divide by y circuit 106. As such, the first clock rate is the master clock rate divided by x, and the second clock rate is the master clock rate divided by y. The second clock rate is at a higher rate than the first clock rate. The first clock 104 is coupled to the sampling module 108, where the first clock rate is the first sampling rate used by the sampling module 108. The sampling module 108 converts the input signal to the digital data according to the first sampling rate. The digital data output from the sampling module 108 is stored in the storage module 114, and is then input to the data conversion module 112, which executes an interpolation method. As described above, in some embodiments, the storage module 114 is internal to the sampling module 108. The interpolation method generates fractionally up-sampled digital data that corresponds to a second sampling rate, where the second sampling rate is larger than the first sampling rate. The second sampling rate is equal to the second clock rate output by the second clock 106. Any interpolation method can be used that calculates the fractionally up-sampled digital data from the digital data values generated according to the first sampling rate. Each data value calculated by the data conversion module is clocked into and out of the holding circuit 110 according to the second clock rate. The data values output from the holding circuit 110 are output from the fractional up-sampling filter 100 as the fractionally up-sampled digital data that corresponds to the second sampling rate. The second sampling rate is at a higher rate than the first sampling rate.

Figure 5:
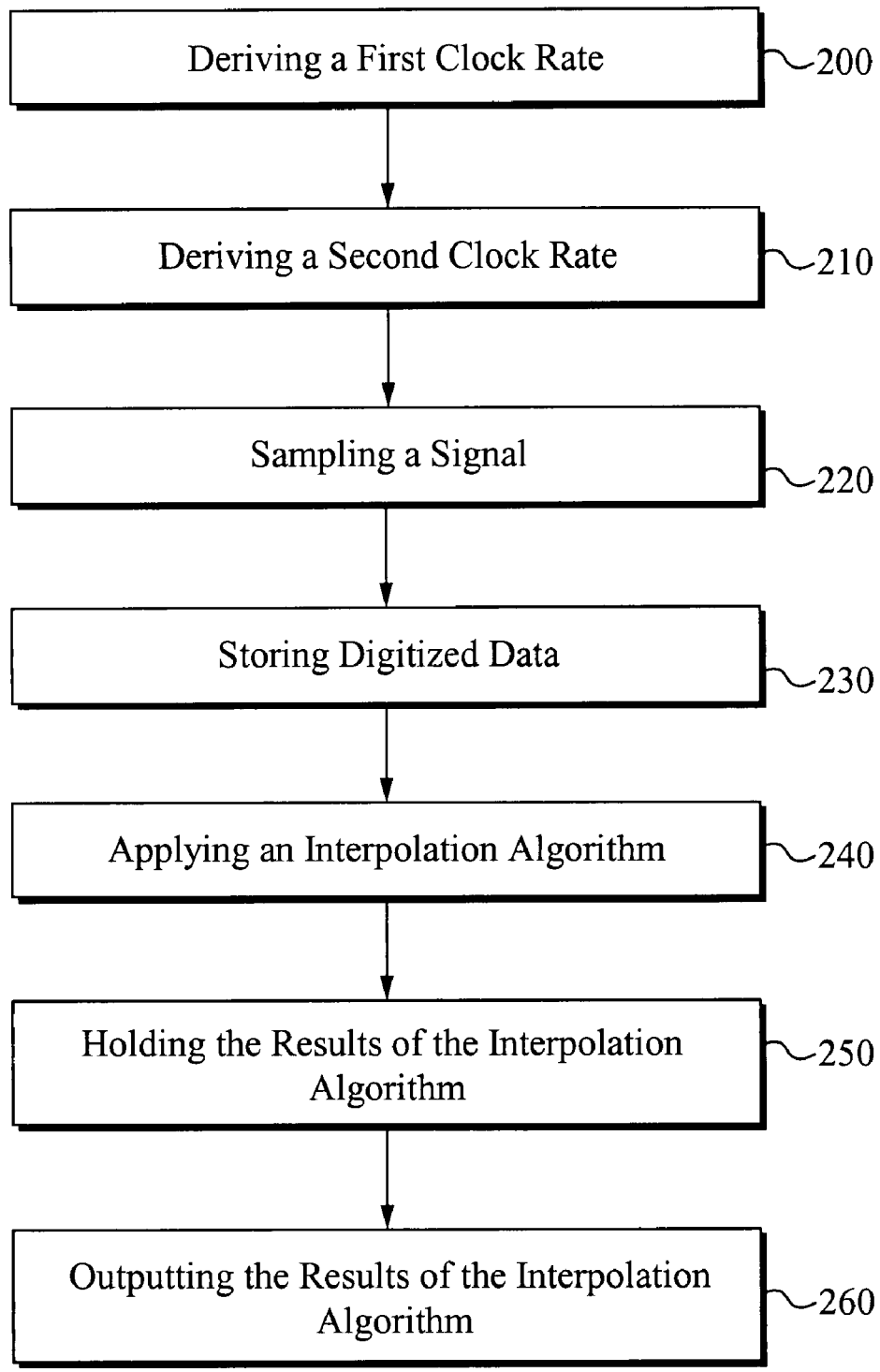
FIG. 5 illustrates a method of fractionally sampling a digital signal. At the step 200, a first clock rate is derived from a master clock rate.

FIG. 5 illustrates a method of fractionally sampling a digital signal. At the step 200, a first clock rate is derived from a master clock rate. At the step 210, a second clock rate is derived from the master clock rate. The second clock rate is different than the first clock rate. At the step 220, an input signal is sampled according to the first clock rate, thereby generating a first digital signal. The first digital signal includes a plurality of first digital data values. Each first digital data value is the result of sampling the input signal. At the step 230, the first digital data is stored. In some embodiments, the step 230 is skipped and the first digital data is not stored. At the step 240, an interpolation algorithm is applied to the plurality of first digital data values. The interpolation algorithm calculates a plurality of second digital data values. A number of second digital data values is calculated according to a fractional sampling factor multiplied by a number of the first digital data values. The fractional sampling factor is a ratio between the second clock rate and the first clock rate. At the step 250, as each of the plurality of second digital data values is calculated at the step 240, each second digital data value is held in temporary memory. Each second digital data value is clocked into memory according to the second clock rate. At the step 260, each of the plurality of digital data values is sequentially output from memory according to the second clock rate, thereby outputting a fractionally sampled digital signal.

It is understood that other filters, such as finite impulse response (FIR) filters and infinite impulse response (IIR) filters, can be applied within the fractional up-sampling filter. It is also understood that besides up-sampling, the fractional sampling method can be applied to down-sampling data rates lower then the original sampling rate.

In one application, the fractional up-sampling filter is coupled to a digital-to-analog converter (DAC) to minimize, if not eliminate, frequency spurs in the receiving band. The fractional up-sampling filter provides fractionally up-sampled digital data as input to the DAC, thereby increasing the sampling rate to the DAC, which has the effect of moving the frequency spur out of the receive band for the input signal output by the DAC.

The present application has been described in terms of specific embodiments incorporating details to facilitate the understanding of the principles of construction and operation of the power amplification circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

We claim:

1. A machine comprising:
   a. a first clock with a first clock rate;
   b. a second clock with a second clock rate different than the first clock rate;
   c. a third clock with a third clock rate, wherein the first clock rate and the second clock rate are each derived from the third clock rate;
   d. a sampling module configured to sample an input signal according to the first clock rate and to output a corresponding digital signal, wherein the digital signal includes a plurality of first digital data values;
   e. a data conversion module coupled to the sampling module to receive the digital signal, wherein the data conversion module is configured to calculate a plurality of second digital data values according to the plurality of first digital data values; and
   f. a holding circuit configured to input, to hold, and to output the plurality of second digital data values according to the second clock rate, thereby outputting a fractionally sampled digital signal.

2. The machine of claim 1 wherein a number of second digital data values is calculated according to a fractional sampling factor multiplied by a number of the first digital data values, wherein the fractional sampling factor is a ratio between the second clock rate and the first clock rate.

3. The machine of claim 2 wherein the first clock comprises a divide by x circuit, and the first clock rate is the third clock rate divided by x.

4. The machine of claim 3 wherein the second clock comprises a divide by y circuit, and the second clock rate is the third clock rate divided by y.

5. The machine of claim 4 wherein the fractional sampling factor is y divided by x.

6. The machine of claim 2 wherein the fractional sampling filter is a fractional up-sampling filter.

7. The machine of claim 6 wherein the second clock rate is greater than the first clock rate.

8. The machine of claim 6 wherein the number of second digital data values is greater than the number of first digital data values.

9. The machine of claim 2 wherein the fractional sampling filter is a fractional down-sampling filter.

10. The machine of claim 9 wherein the second clock rate is less than the first clock rate.

11. The machine of claim 9 wherein the number of second digital data values is less than the number of first digital data values.

12. The machine of claim 2 wherein an interpolation algorithm is configured to use different filter coefficients applied to first digital data values, wherein each filter coefficient is determined by a relative timing of the second clock rate versus the first clock rate.

13. The machine of claim 2 wherein an interpolation method comprises a linear interpolation whereby each second digital data value is calculated by averaging two or more first digital data values most adjacent to the second digital data value.

14. The machine of claim 2 further comprising a digital-to-analog converter coupled to the fractional sampling filter, wherein the fractionally sampled digital signal is input to the digital-to-analog converter, and the digital-to-analog converter is configured to convert the fractionally sampled digital signal to an output signal, thereby reducing frequency spurs in the receiving band of the output signal.

15. A method comprising:
   a. deriving a first clock rate from a master clock rate;
   b. deriving a second clock rate from the master clock, wherein the second clock rate is different than the first clock rate;
   c. sampling an input signal according to the first clock rate, thereby generating a first digital signal, wherein the first digital signal includes a plurality of first digital data values;
   d. calculating a plurality of second digital data values according to the plurality of first digital data values;
   e. holding each of the plurality of second digital data values as each second digital data value is calculated; and
   f. sequentially outputting each of the plurality of digital data values according to the second clock rate, thereby outputting a fractionally sampled digital signal.

16. A machine comprising:
   a. a receiver portion configured to receive radio frequency signals in a receive frequency band; and
   b. a transmitter portion including a fractional sampling filter, wherein the fractional sampling filter includes:
      i. a sampling module configured to sample an analog signal according to a first clock rate and to output a first digital signal; and
      ii. a module configured to calculate a plurality of data values based on the first digital signal, the first clock rate, and a second clock rate different than the first clock rate, wherein the first clock rate and the second clock rate are determined based on the receive frequency band.

17. The machine of claim 16 further comprising a digital-to-analog converter configured to convert a digital signal based on the plurality of data values to an analog signal.

* * * * *